United States Patent [19]

Millea

[11] 4,184,896
[45] Jan. 22, 1980

[54] SURFACE BARRIER TAILORING OF SEMICONDUCTOR DEVICES UTILIZING SCANNING ELECTRON MICROSCOPE PRODUCED IONIZING RADIATION

[75] Inventor: Michael F. Millea, Manhattan Beach, Calif.

[73] Assignee: The United States of America as represented by the Secretary of the Air Force, Washington, D.C.

[21] Appl. No.: 913,186

[22] Filed: Jun. 6, 1978

[51] Int. Cl.² ............... H01L 21/26; H01L 21/324; H01L 29/78
[52] U.S. Cl. ............................. 148/1.5; 29/576 B; 250/492 A; 357/23; 357/24; 357/29; 357/52; 357/91
[58] Field of Search ............ 148/1.5; 250/492 A, 250/492 B; 29/576 B; 357/29, 52, 91, 24, 23; 427/35

[56] References Cited
U.S. PATENT DOCUMENTS

| | | | |
|---|---|---|---|
| 3,507,709 | 4/1970 | Bower | 357/52 X |
| 3,691,376 | 9/1972 | Bauerlein et al. | 357/52 X |
| 3,755,092 | 8/1973 | Antula | 204/35 N |
| 3,796,932 | 3/1974 | Amelio et al. | 357/24 |
| 3,829,961 | 8/1974 | Bauerlein et al. | 357/29 |
| 3,886,530 | 5/1975 | Huber et al. | 357/23 X |
| 3,888,701 | 6/1975 | Tarneja et al. | 148/1.5 |
| 4,109,029 | 8/1978 | Ozdemir et al. | 250/492 A |

OTHER PUBLICATIONS

Tokuyama et al., "Si–SiO₂ Interface States . . . Ion Species", Textbook, Ion Implantation in Semiconductors . . ., 1973, pp. 159-168.
Donovan et al., "Radiation Hardening . . . Displacement Damage", J. Applied Physics, vol. 43, No. 6, Jun. 1972, pp. 2897-2899.
Broers et al., "Microcircuits by Electron Beam", Scientific American, Nov. 1972, pp. 34-44.
Bhatia et al., "Irradiation Technique . . . Charge-Coupled Storage Cell", I.B.M. Tech. Discl. Bull., vol. 15, No. 3, Aug. 1972, pp. 723-724.

*Primary Examiner*—L. Dewayne Rutledge
*Assistant Examiner*—W. G. Saba
*Attorney, Agent, or Firm*—Joseph E. Rusz; Henry S. Miller

[57] ABSTRACT

A method of spatially tailoring the surface barrier of MOS devices by means of a scanning electron microscope using ionizing radiation at the silicon dioxide-silicon interface to control the surface charge distribution. The MOS is subsequently annealed at about 300° C. for several hours to stabilize the surface potential.

1 Claim, 5 Drawing Figures

SURFACE BARRIER TAILORING OF SEMICONDUCTOR DEVICES UTILIZING SCANNING ELECTRON MICROSCOPE PRODUCED IONIZING RADIATION

STATEMENT OF GOVERNMENT INTEREST

The invention described herein may be manufactured and used by or for the Government for governmental purposes without the payment of any royalty thereon.

BACKGROUND OF THE INVENTION

This invention relates generally to metal-oxide-semiconductor (MOS) devices and more particularly to a method for spatially tailoring the surface barrier of MOS devices by means of the scanning electron microscope. The degradation of MOS devices due to ionizing radiation is believed to result from trapping of photogenerated holes near the $SiO_2$-silicon interface. These trapped positive charges in the oxide cause the electrostatic potential for electrons at the silicon surface to be lowered. The radiation damage is believed to occur as follows: the ionizing radiation creates electron-hole pairs in the insulator, a photogenerated negative charge flows out of the oxide but the positive charges become trapped near the silicon substrate. An equivalent circuit could be thought of as a first layer of metal considered a gate. A second layer called an oxide trap, the third layer, the silicon dioxide-silicon interface and the final layer the bulk silicon. A shunt resistance connects the bulk silicon with the silicon dioxide-silicon interface. The shunt resistance between the bulk and surface of the substrate represents the surface barrier impedance. This impedance is similar to what one would use to characterize the leakage resistance of a p-n junction. The net effect of ionizing radiation is to deposit a positive charge on the metal plate representing oxide traps.

The radiation effect just described can be quickly annealed out at 500° C. but is eliminated much slower at lower temperatures. In one particular case, the device was seventy percent recovered after ten minutes but still not completely recovered after four hundred minutes. From this, I discovered that it is possible to introduce trapped holes which are stabilized for storage temperatures below 200° C.

With an SEM exposure, it is possible to spatially control the surface barrier of an MOS device. A short anneal at about 300° C. is sufficient to stabilize the surface potential from annealing under typical device operating temperatures.

SUMMARY OF THE INVENTION

The invention involves a method of utilizing a scanning electron microscope to administer heavy doses of ionizing radiation to selected regions of an electronic semiconductor device such as metal-oxide-semiconductor device.

The functional dependence of the silicon surface charge distribution on the gate potential of an MOS device depends on the concentration of trapped charges in the insulating region. In this invention a method of spatially tailoring the oxide trapped charge is presented.

The scanning electron microscope has an electron beam that may be controlled with relative simplicity. The beam may be controlled not only with regard to longitudinal and transverse scanning but also with regard to penetration depth as well. By selectively administering the heavy amounts of radiation via the SEM it is possible to deposit a positive charge near the surface barrier and therefore more readily control the gate potential required for proper functioning of the device.

It is therefore an object of the invention to provide a new and improved method for tailoring the surface barrier of a semiconductor device.

It is another object of the invention to provide a new and improved method to spatially control the surface barrier of an MOS device.

It is a further object of the invention to provide a new and improved method of spatially tailoring the oxide trapped charge in a planar semiconductor device.

It is still a further object of the invention to provide a new and improved method of irradiating semiconductor devices that is low in cost, practical for manufacturing purposes and accurate.

It is another object of the invention to provide a new and improved method of utilizing a scanning electron microscope in the manufacture of semiconductor devices.

These and other advantages, features and objects of the invention will become more apparent from the following description taken in connection with the illustrative embodiment in the accompanying drawings.

DESCRIPTION OF THE PREFERRED EMBODIMENT

Before referring to the figures, consider an MOS device with a p-type (or m-type) silicon substrate, as may be used, for example in a charged coupled device (CCD).

Upon the instantaneous application of a negative gate voltage, $V_G$ $$V_G - V_{FB} = \phi_s + 1/C_o (2\epsilon_s q N \phi_s)^{\frac{1}{2}} \tag{1}$$

where $V_{FB}$; flat-band voltage
$\phi_s$; surface potential
$\epsilon_s$; substrate dielectric constant
N; substrate doping
$C_o$; insulator capacitance In this equation, the flat-band voltage is the electrostatic potential between the silicon dioxide—silicon interface on one hand and the oxide trap on the other hand, as discussed in the background of the invention. The surface potential is the potential between the bulk and surface of the substrate (i.e., the depth of the potential well for holes at the surface). The voltage drop across the oxide is the last term in the above equation. The flat-band voltage is the gate bias required to make the surface potential zero and can be written as $$V_{FB} = \phi_{MS} - Q_{ss}/C_o \tag{2}$$

where $\phi_{MS}$ is the metal-semiconductor contact potential difference and $Q_{ss}$ is used as an effective surface charge density to account for the volume charge density distributed throughout the insulator. When free electrons are located in the surface potential well, this charge should be added to $Q_{ss}$. Solving for the surface potential, one has $$\phi_s = V_o + V - (V_o^2 + 2VV_o)^{\frac{1}{2}} \qquad (3)$$

where $$V = V_G - V_{FB}$$

and $$V_o - \epsilon_s qN/C_o^2$$

For large gate voltage, the surface potential is a linear function of the flat-band voltage and thereby the number of trapped positive charges created by ionizing radiation.

Figure 1A:
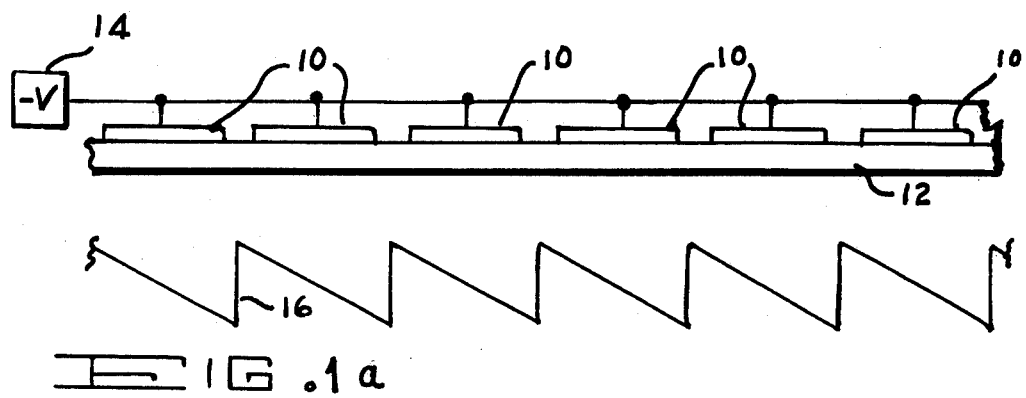
FIGS. 1a–1c is a schematic representation of the construction of a two phase CCD by surface barrier tailoring.
Figure 1B:
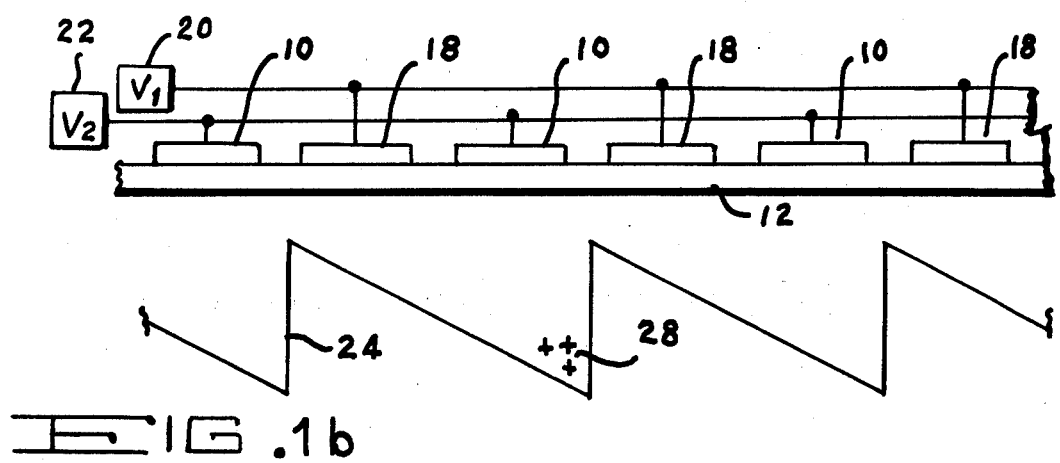
Figure 1C:
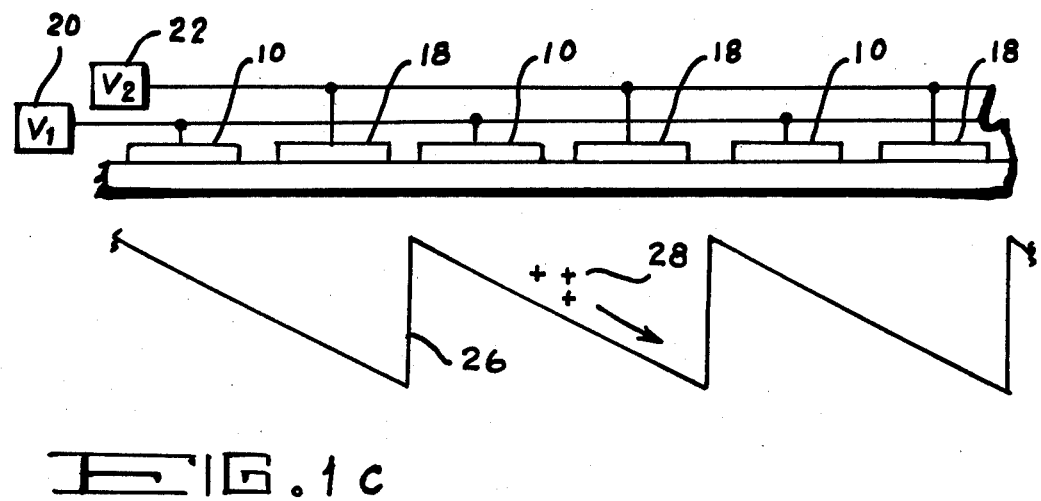

Concerning FIG. 1, consider a series of closely spaced metal electrodes 10 under which a linearly graded concentration of positive oxide charges have been created (12). If all gates are connected to a common negative potential 14, the potential wells at the surface will be as illustrated at 16 in FIG. 1a. Connecting alternating electrodes (10, 18) together and applying the appropriate negative voltages 20, 22 to each set of gates will result in the energy wells 24 shown in FIG. 1b. The deeper potential wells correspond to the higher negative gate bias. Reversing the biases (22, 20) on the two sets of gates (10, 18) will cause the potential wells 24 to change as shown in FIG. 1c.

If free electrons 28 (or holes for opposite type substrate and applied bias) exist in any potential well, they will be shifted to the right when the gates are clocked. In effect, one has realized a two-phase clock.

Also, when electrons are being transferred, they are driven by an electric field. This built-in field, due to surface barrier tailoring, is useful not only in CCD devices but also in controlling the surface channel of MOSFET's.

Figure 2A:
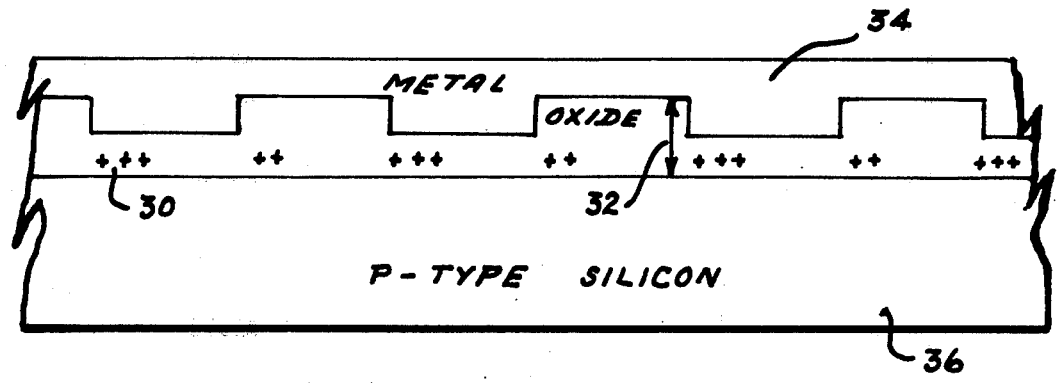
FIG. 2a and 2b is a schematic representation of the construction of a single phase CCD by surface barrier tailoring.
Figure 2B:
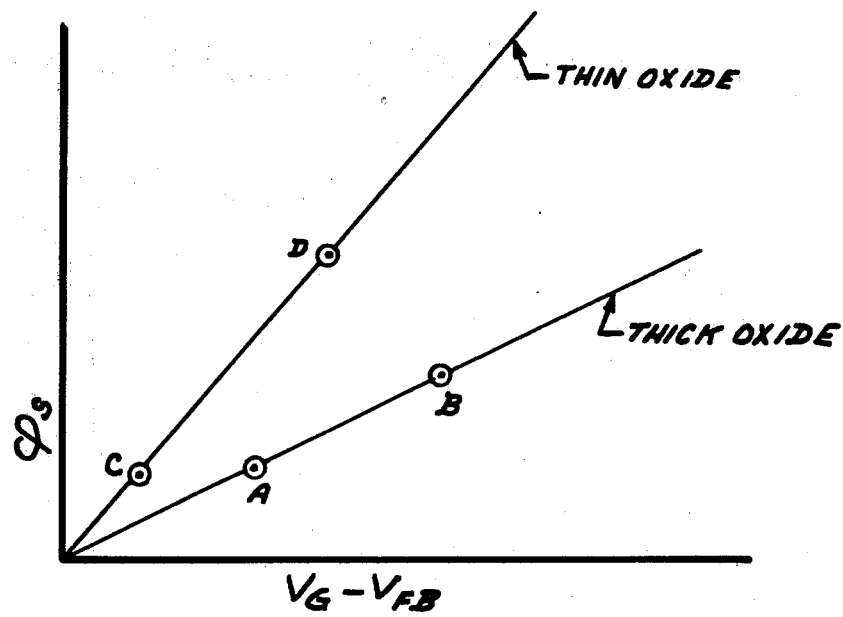

As a further example of the usefulness of tailoring surface barriers, consider an MOS structure in which the oxide is of a non-uniform thickness as illustrated in FIG. 2a. According to Eq. 3, the surface potential 30 will vary along the surface due to a variation in the oxide thickness 32 (i.e., as the oxide thickness varies so will the capacitance between the metal gate 34 and semiconductor 36). The surface potential 30 as a function of applied bias given by Eq. 3 is schematically illustrated in FIG. 2b for two oxide thicknesses. It can be seen from this figure that, with properly controlled flat-band voltages, it is possible to have the location of the deepest part of the potential wells change location with applied voltage. This is illustrated in FIG. 2b. Points A and B in this figure correspond to the potential wells under the thicker insulator when the gate potential is changed, whereas points C and D correspond to the wells under the thin oxide. The final step is to grade the potential wells under each oxide thickness as was done in FIG. 1 to complete the construction of a one-phase CCD.

Although the invention has been described with reference to a particular embodiment it will be understood to those skilled in the art that the invention is capable of a variety of alternative embodiments within the spirit and scope of the appended claims.

I claim:

1. In metal-oxide-silicon semiconductor devices, a method of spatially tailoring the surface barrier charge comprising; the steps of exposing trapped positive charges in silicon dioxide at a silicon dioxide—silicon interface to a heavy dose of ionizing radiation from a scanning electron microscope, whereby the electrical potential at the silicon surface is lowered; and annealing the device at about 300° C. sufficiently to stabilize the surface potential.

* * * * *